United States Patent
Funaki (10) Patent No.: US 6,744,184 B2
(45) Date of Patent: Jun. 1, 2004

(54) PIEZOELECTRIC RESONATOR

(75) Inventor: Hirofumi Funaki, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 174 days.

(21) Appl. No.: 09/994,653

(22) Filed: Nov. 28, 2001

(65) Prior Publication Data

US 2002/0079786 A1 Jun. 27, 2002

(30) Foreign Application Priority Data

Dec. 26, 2000 (JP) .................................. 2000-394249

(51) Int. Cl.[7] .............................................. H01L 41/04
(52) U.S. Cl. ............................................................. 310/366
(58) Field of Search ................................ 310/321, 322, 310/348, 357, 368, 320, 367, 365, 358, 346, 366, 328, 359; H03H 9/58; H01L 41/04

(56) References Cited

U.S. PATENT DOCUMENTS

| | | | | |
|---|---|---|---|---|
| 4,759,107 A | * | 7/1988 | Ogawa et al. | 310/366 |
| 4,894,580 A | * | 1/1990 | Ogawa | 310/320 |
| 6,198,200 B1 | * | 3/2001 | Kaida et al. | 310/320 |
| 6,229,246 B1 | * | 5/2001 | Kaida | 310/320 |
| 6,420,945 B1 | * | 7/2002 | Yamamoto et al. | 310/366 |
| 6,466,107 B2 | * | 10/2002 | Yamamoto | 333/189 |

FOREIGN PATENT DOCUMENTS

EP  0247540  * 5/1987  ........... H01L/41/08

* cited by examiner

*Primary Examiner*—Burton S. Mullins
*Assistant Examiner*—Karen Beth Addison
(74) *Attorney, Agent, or Firm*—Keating & Bennett, LLP

(57) ABSTRACT

A piezoelectric resonator uses a radial flexural mode vibration. In the piezoelectric resonator, an even number of at least four electrode layers and an odd number of at least three piezoelectric layers are alternately stacked. Among the three piezoelectric layers, at least two piezoelectric layers are polarized in a thickness direction. The four electrode layers are connected to one another so that, in at least one piezoelectric layer among the three piezoelectric layers, an electric field is generated in a direction that is identical to the polarization direction of the at least one piezoelectric layer, and in at least another piezoelectric layer among the three piezoelectric layers, an electric field is generated in a direction that is opposite to the polarization direction of the at least another piezoelectric layer. Among the three piezoelectric layers, at least one piezoelectric layer has a thickness that is different from each of the thicknesses of the other piezoelectric layers.

11 Claims, 7 Drawing Sheets

× POLARIZATION OF CENTRAL PIEZOELECTRIC LAYER

FIG. 5

× POLARIZATION OF CENTRAL PIEZOELECTRIC LAYER

FIG. 6

× POLARIZATION OF CENTRAL PIEZOELECTRIC LAYER

PIEZOELECTRIC RESONATOR

BACKGROUND OF THE INVENTION

1. Field of the Invention

The present invention relates to piezoelectric resonators using a radial flexural mode vibration.

2. Description of the Related Art

General piezoelectric resonators for use in kilohertz bands, particularly in 100 kHz to 1 MHz use an area expansion mode vibration. In a piezoelectric resonator using area expansion mode vibration, the product of the length Ls of a side and resonant frequency fr is substantially constant, and is represented by the following expression:

$$Ls \times fr = As$$

where As represents a constant (frequency constant) and As≈2100 mmkHz. For example, in a resonator having a resonant frequency fr=455 kHz as in an AM filter, the length of a side is represented by Ls=4.62 mm.

In recent years, electronic devices have been in the process of being reduced in size, and it is also necessary that electronic components have small sizes and reduced thicknesses. Under such circumstances, it is not preferable to use an electronic component as described above, in which a side length is about 5 mm.

In addition, the attenuation characteristics of a ladder filter are determined by the ratio between the capacitance of a parallel resonator and the capacitance of a series resonator. In other words, in order to achieve a large attenuation, the inter-terminal capacitance of the parallel resonator is increased, while the inter-terminal capacitance of the series resonator is reduced. However, to increase the inter-terminal capacitance of the parallel resonator, the thickness of the piezoelectric substrate of the parallel resonator must be reduced, so that the mechanical strength decreases. Accordingly, there is a limitation on the range of selectable thicknesses.

In view of the above-described circumstances, the assignee of the present application has proposed a piezoelectric resonator, which is described in Japanese Patent Application No. 11-294491. In this piezoelectric resonator, groups of at least four electrode layers and groups of at least three piezoelectric layers are alternately stacked and in each piezoelectric group, at least two piezoelectric layers are polarized, and in which the electrode layers are connected to one another so that a portion of the piezoelectric layers has an electric field generated in a direction that is identical to the polarization direction of the two piezoelectric layers and another portion of the piezoelectric layers has an electric field generated in a direction that is opposite to the polarization direction of the two piezoelectric layers.

In the entirety of the above-described piezoelectric resonator, radial flexural mode vibration occurs because piezoelectric layers in which the polarization direction and the electric field direction are identical contract, and piezoelectric layers in which the polarization direction and the electric field direction are opposite expand. In this type of piezoelectric resonator using radial flexural mode vibration, dimensions can be reduced at the same resonant frequency, compared with a piezoelectric resonator using area expansion mode vibration. Since the piezoelectric resonator using radial flexural mode vibration has at least four electrode layers, an inter-terminal capacitance can be generated between adjacent electrode layers and can be increased. In addition, the stacking of the piezoelectric layers is performed. Thus, it is ensured that the entirety of the piezoelectric layers has sufficient mechanical strength, even if each piezoelectric layer has a small thickness.

Nevertheless, the piezoelectric resonator using radial flexural mode vibration has the following problems. The piezoelectric layers of this piezoelectric resonator have identical thicknesses. Thus, assuming that the entirety of the piezoelectric resonator as a device is constant, when n piezoelectric layers are stacked, the thickness of one piezoelectric layer is represented by 1/n. At this time, the inter-terminal capacitance is represented by the square of n. Accordingly, a rate of capacitive change is large, and the degree of freedom in design of capacitance is limited.

In addition, to obtain a predetermined capacitance, the thickness of the entire device, the number of layers, material properties, etc., must be changed, and as a result complications in processing steps and increases in costs are inevitable.

SUMMARY OF THE INVENTION

In order to overcome the problems described above, preferred embodiments of the present invention provide a very small piezoelectric resonator in which a capacitance is accurately controlled without changing the number of stacked piezoelectric layers and the thickness of the entire resonator.

According to a preferred embodiment of the present invention, a piezoelectric resonator uses radial flexural mode vibration and includes an even number of at least four electrode layers and an odd number of at least three piezoelectric layers which are alternately stacked, wherein at least two piezoelectric layers among the three piezoelectric layers are polarized in a thickness direction, the four electrode layers are connected to one another so that, in at least one piezoelectric layer among the three piezoelectric layers, an electric field is generated in a direction that is identical to the polarization direction of the at least one piezoelectric layer, and in at least another piezoelectric layer among the three piezoelectric layers, an electric field is generated in a direction that is opposite to the polarization direction of the at least another piezoelectric layer, and among the three piezoelectric layers, at least one piezoelectric layer has a thickness that is different from each of the thicknesses of the other piezoelectric layers.

According to preferred embodiments of the present invention, the entirety of a piezoelectric resonator generates radial flexural mode vibration because piezoelectric layers in which polarization directions and electric field directions are identical contract two-dimensionally, and piezoelectric layers in which polarization directions and electric field directions are opposite expand. This piezoelectric resonator using radial flexural mode vibration can be made much smaller than a piezoelectric resonator using area expansion mode vibration, if the same resonant frequency is used. For example, when a resonator has a resonant frequency fr=455 kHz, each side of a resonator using area expansion mode vibration is approximately 4.62 mm long, while each side of a resonator using radial flexural mode vibration can be set at approximately 1.4 mm.

Among the three piezoelectric layers, at least one piezoelectric layer has a different thickness than the other piezoelectric layers. For example, in the case of a three-layer piezoelectric resonator, when the length of a side is represented by Lb, the dielectric constant of the piezoelectric layers is represented by $\in$, the thickness of the central piezoelectric layer is represented by $t_2$, and the thicknesses of outer piezoelectric layers are represented by $t_1$ and $t_3$, inter-terminal capacitance Cb is given by the following expression:

$$Cb=(\in \cdot \in_0 \cdot Lb^2)(1/t_1+1/t_2+1/t_3)$$

where $\in_0$ represents the permeability of vacuum, and $t_1+t_2+t_3=T_0$.

When $t_1=t_2=t_3$, $$Cb=(\in \cdot \in_0 \cdot Lb^2)(9/T_0)$$

If $t_1=t_3=t_2/2$, $$Cb=(\in \cdot \in_0 \cdot Lb^2)(10/T_0)$$

Also, when $t_1=t_3=2 \cdot t_2$, $$Cb=(\in \cdot \in_0 \cdot Lb^2)(10/T_0)$$

As described above, by setting the thickness of at least one piezoelectric layer to differ from each of the thicknesses of the other piezoelectric layers, inter-terminal capacitance can be changed, without increasing or reducing the number of piezoelectric layers.

Preferably, the three piezoelectric layers have a relationship expressed by:

$$t_1=t_3 \neq t_2$$

By using the above relationship, radial flexural mode vibration is symmetric in top and bottom surface directions because the outer piezoelectric layers have substantially equal thicknesses, so that preferable resonant characteristics can be obtained.

The three piezoelectric layers may have a relationship expressed by:

$$1<t_1/t_2<3 \text{ and } 1<t_3/t_2<3$$

In other words, by setting the thickness of each piezoelectric layer to be larger than the thickness of the central piezoelectric layer, a piezoelectric resonator having large $\Delta F$ (=fa−fr) can be obtained and a piezoelectric resonator having a broad bandwidth can be obtained.

Among the three piezoelectric layers, the central piezoelectric layer may be piezoelectrically polarized in the thickness direction.

Alternatively, among the three piezoelectric layers, the central piezoelectric layer may not have piezoelectric characteristics in the thickness direction.

According to preferred embodiments of the present invention, in the range $t_1/t_2<3$, wherein $t1=t3$, large $\Delta F$ can be obtained by setting the central piezoelectric layer to have piezoelectric characteristics in the thickness direction, while in the range $t_1/t_2>3$, large $\Delta F$ can be obtained by setting the central piezoelectric layer not to have piezoelectric characteristics.

When the central piezoelectric layer does not have piezoelectric characteristics, the dimensions of the entire device can be greatly reduced, compared with the case in which the central piezoelectric layer has piezoelectric characteristics.

According to preferred embodiments of the present invention, in a piezoelectric resonator which uses radial flexural mode vibration and which includes an even number of at least four electrode layers and an odd number of at least three piezoelectric layers which are alternately stacked, and in which at least two piezoelectric layers among the three piezoelectric layers are polarized in a thickness direction, at least one piezoelectric layer has a thickness that is different from each of the thicknesses of the other piezoelectric layers. Thus, inter-terminal capacitance can be freely changed, without changing the overall thickness of the device, the number of layers stacked, material properties, and other characteristics.

The capacitance can be sequentially changed based on the thickness of the piezoelectric layers. Thus, the capacitance can be easily controlled to come close to a target capacitance. Accordingly, when mounting the piezoelectric resonator on a circuit board or other mounting surface, impedance matching to an external circuit can be easily performed.

In addition, by changing the thickness of the piezoelectric layers, not only the capacitance but also $\Delta f$ can be adjusted and the bandwidth of the piezoelectric resonator can be adjusted. Also, by changing the thickness of each piezoelectric layer, the device dimension can be changed, even in the case of using the same resonant frequency, the same number of layers stacked, and the same overall thickness.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
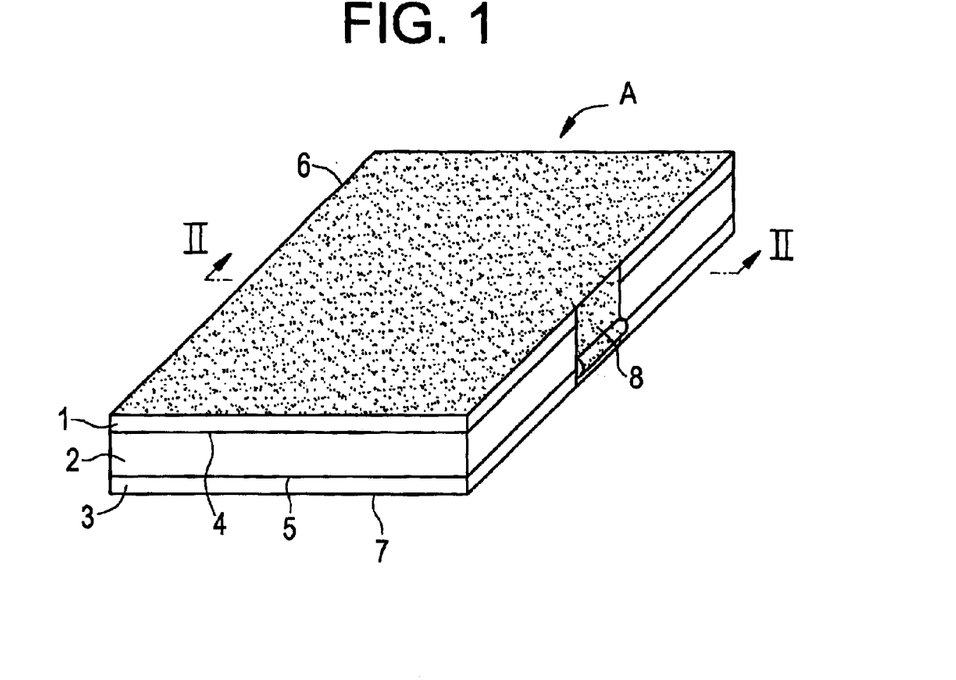
FIG. 1 is a perspective view showing a piezoelectric resonator according to a first preferred embodiment of the present invention.
Figure 2:
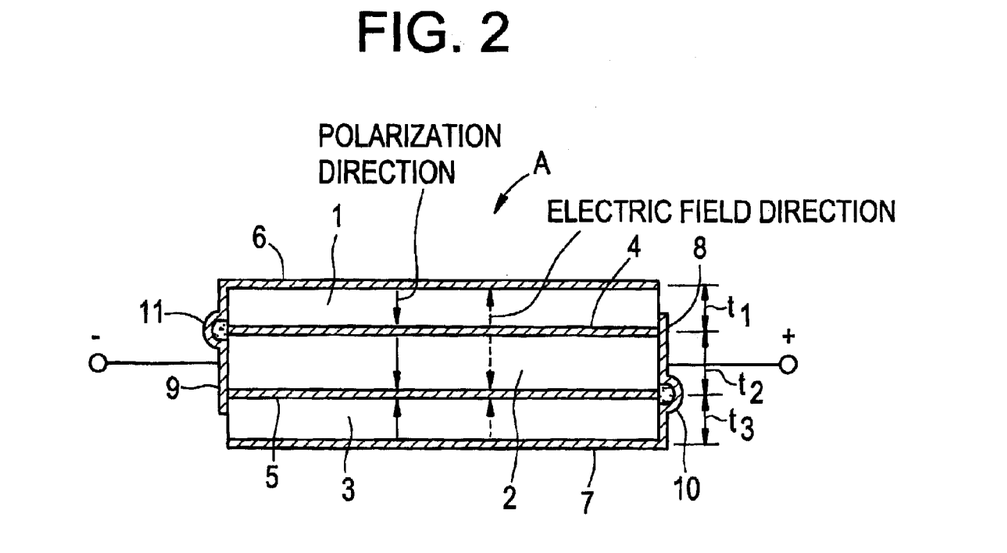
FIG. 2 is a sectional view showing the piezoelectric resonator shown in FIG. 1.

FIGS. 1 and 2 show a piezoelectric resonator A according to a first preferred embodiment of the present invention, which uses a radial flexural mode vibration.

The piezoelectric resonator A is preferably a ceramic resonator for use in frequency bands from approximately 100 kHz to approximately 1 MHz. The piezoelectric resonator A preferably includes at least three stacked, substantially square piezoelectric layers 1 to 3 having internal electrodes 4 and 5 provided therebetween, and a top surface electrode 6 and a bottom surface electrode 7 which are respectively disposed on the outer main surfaces of the piezoelectric layers 1 and 3.

The piezoelectric resonator A is constructed to satisfy a relationship of $t_1 = t_3 \neq t_2$, where $t_2$ represents the thickness of the central piezoelectric layer 2, and $t_1$ and $t_3$ respectively represent the thicknesses $t_1$ and $t_3$ of the outer piezoelectric layers 1 and 3.

Among the piezoelectric layers 1 to 3, the outer piezoelectric layers 1 and 3 are oppositely polarized, and the central piezoelectric layer 2 is polarized in a direction that is identical to that in the upper piezoelectric layer 1, as indicated by the solid-line arrows in FIG. 2. Each of the piezoelectric layers 1 and 3 may have an inward polarization direction that is directed toward the center, as indicated in FIG. 2, or may have an outwardly directed polarization direction. On two sides of the piezoelectric layers 1 to 3, particularly in the approximate centers of two opposite sides, connection electrodes 8 and 9 are provided. The connection electrode 8 is connected to the internal electrode 4 and the bottom surface electrode 7 and is insulated from the internal electrode 5 from the an insulating material 10 on the side. The other connection electrode 8 is connected to the top surface electrode 6 and the internal electrode 5 and is insulated from the internal electrode 4 by an insulating material 11 on the other side.

The insulating materials 10 and 11 are provided in order to insulate the connection electrode 8 from the internal electrode 5 and to insulate the connection electrode 9 from the internal electrode 4, respectively. Instead, on edges of the internal electrodes 5 and 4, cutouts for insulating the internal electrodes 5 and 4 from the connection electrodes 8 and 9 may be provided. The electrical characteristics of the piezoelectric resonator A are extracted from the connection electrodes 8 and 9 or the top and bottom surface electrodes 6 and 7.

In the above-described piezoelectric resonator A, when a positive potential is applied to the connection electrode 8, and a negative potential is supplied to the connection electrode 9, electric fields having identical directions are generated in the outer piezoelectric layers 1 and 3, and an electric field is oppositely generated in the central piezoelectric layer 2. Accordingly, in the upper piezoelectric layer 1, the polarization direction and the electric field direction are opposite, and in the central piezoelectric layer 2 and the lower piezoelectric layer 3, the polarization directions and the electric field directions are identical. The piezoelectric layer 1 in which the polarization direction and the electric field direction are opposite expands two-dimensionally, and the piezoelectric layers 2 and 3 in which the polarization directions and the electric field directions are identical contract. Thus, the entirety of the piezoelectric resonator A bends upward convexly. When the electric field directions are reversed, the piezoelectric resonator A bends in a reverse direction. Therefore, by applying a high-frequency electric field across the connection electrodes 8 and 9, radial flexural mode vibration occurs in the piezoelectric resonator A at a predetermined frequency.

Figure 3A:
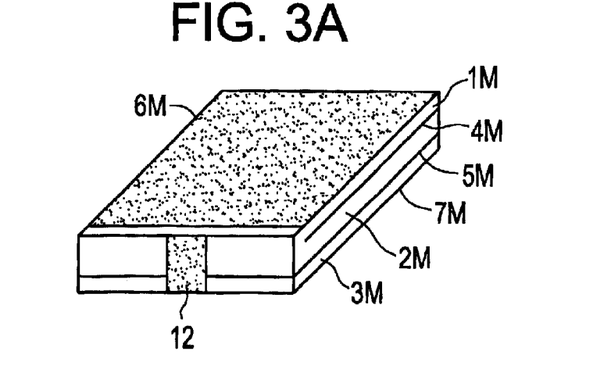
FIGS. 3A, 3B, and 3C are a perspective view, a section view, and a perspective view which show the process of manufacturing the piezoelectric resonator shown in FIG. 1.
Figure 3B:
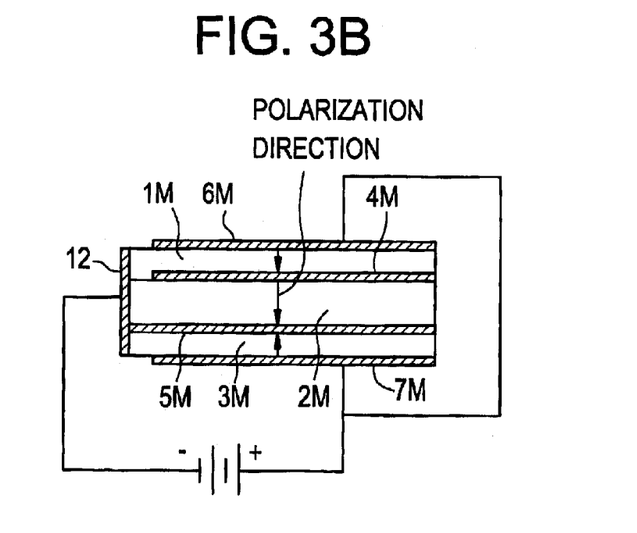
Figure 3C:
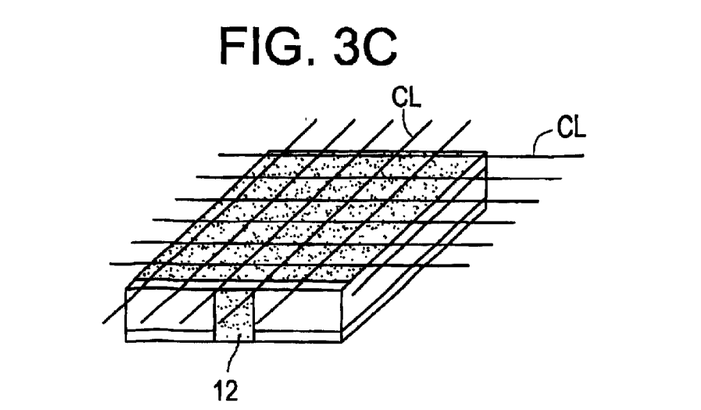

FIGS. 3A to 3C show the process of manufacturing the piezoelectric resonator A.

FIG. 3A shows a mother-substrate state. Mother substrates 1M, 2M, and 3M which respectively correspond to the piezoelectric layers 1 to 3 are stacked, with internal electrodes 4 and 5 provided therebetween. Electrodes 6M and 7M are provided on the front and back surfaces of the stacked substrates, respectively. At one end of the stacked substrates, a polarization electrode 12 which is conductive to only the internal electrode 5M is provided.

Next, as shown in FIG. 3B, by applying a high voltage between the top and bottom surface electrodes 6M and 7M, and the polarization electrode 12, the three piezoelectric layers 1 to 3 are polarized in the directions indicated by the arrows.

After that, as shown in FIG. 3C, by vertically and horizontally cutting the stacked mother substrates along cutlines CL into small pieces, and forming connection electrodes 8 and 9 on sides of each piece, the piezoelectric resonator A shown in FIG. 1 is obtained.

By using the structure of the above-described piezoelectric resonator A, various types of the piezoelectric resonator A were produced using conditions that the thickness of the entirety is constant (0.18 mm), $t_1 = t_3$, and $t_1/t_2 = 0.25$ to 10. The results of measuring the electric characteristics of the piezoelectric resonators A are shown in FIGS. 4 to 6.

Figure 4:
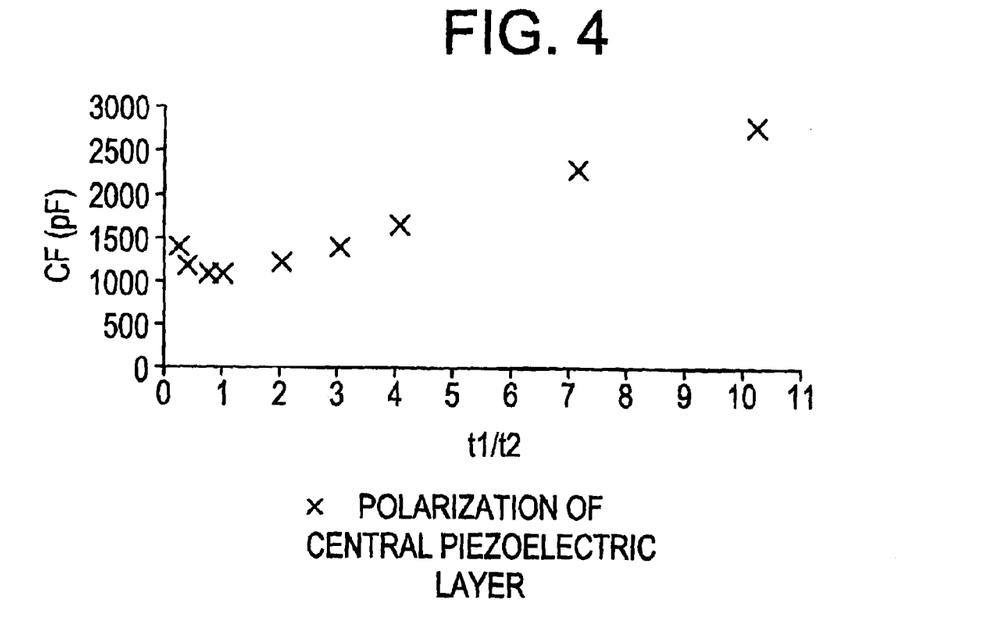
FIG. 4 is a graph showing the relationship between capacitance and the ratio in thickness of each outer piezoelectric layer relative to the central piezoelectric layer in the piezoelectric resonator shown in FIG. 1.

FIG. 4 shows a change in inter-terminal capacitance CF obtained when changing $t_1/t_2$.

Figure 5:
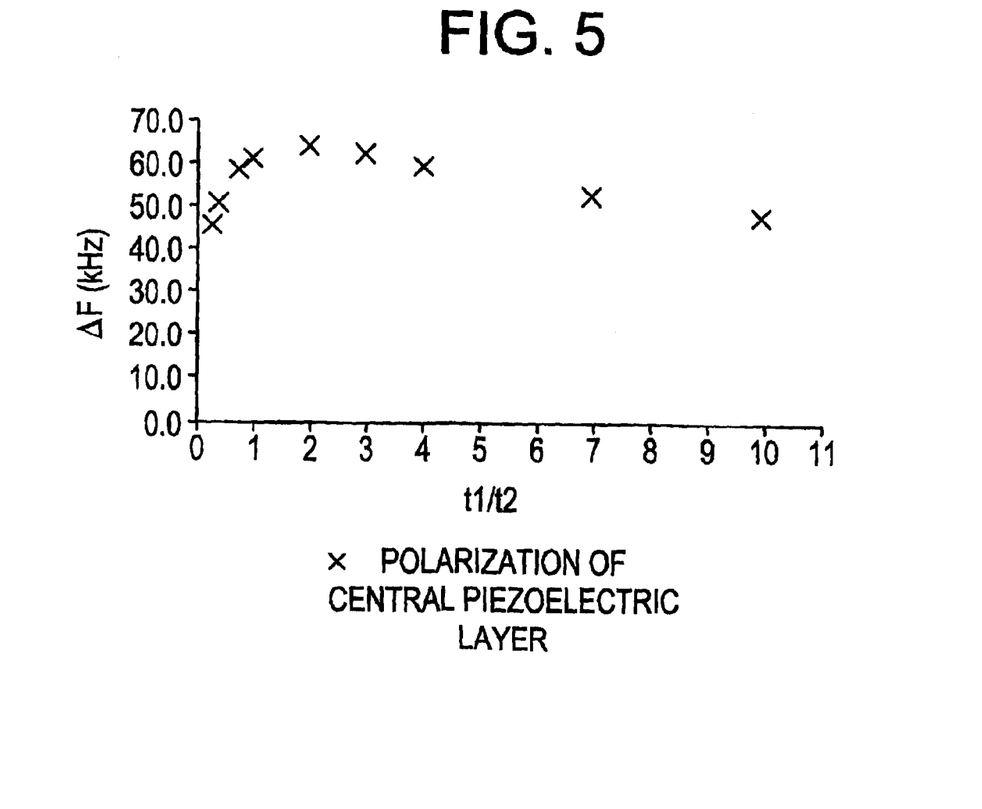
FIG. 5 is a graph showing the relationship between the ratio in thickness of each outer piezoelectric layer relative to the central piezoelectric layer and $\Delta F$ in the piezoelectric resonator shown in FIG. 1.

FIG. 5 shows a change in $\Delta F$ ($= fa - fr$) obtained when changing $t_1/t_2$.

Figure 6:
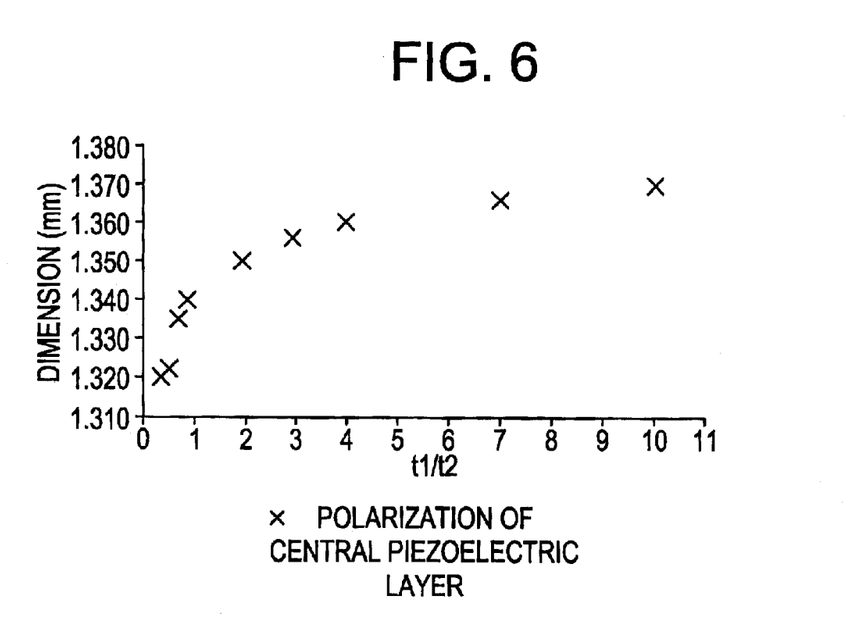
FIG. 6 is a graph showing the relationship between the ratio in thickness of each outer piezoelectric layer to relative the central piezoelectric layer and device size in the piezoelectric resonator shown in FIG. 1.

FIG. 6 shows a change in a device dimension (one side) obtained when changing $t_1/t_2$, where resonant frequency fr=400 kHz.

As is clear from FIG. 4, when $t_1/t_2 = 1$, inter-terminal capacitance CF is minimal, and when $t_1/t_2 < 1$ and $t_1/t_2 > 1$, inter-terminal capacitance CF is large. In particular, increasing $t_1/t_2$ to be greater than 1 increases inter-terminal capacitance CF. When $t_1/t_2 = 10$, the inter-terminal capacitance CF is increased approximately by about three times of that obtained when $t_1/t_2 = 1$.

As described above, by changing $t_1/t_2$, inter-terminal capacitance CF can be freely varied.

As is clear from FIG. 5, $\Delta F$ exceeds about 30 kHz in a range of $1 < t_1/t_2 < 3$, and a piezoelectric resonator having large $\Delta F$ can be obtained.

FIG. 6 indicates that, as the value of $t_1/t_2$ is smaller, the device dimension can be much smaller. In particular, setting $t_1/t_2 < 1$, the device dimension is about 1.34 mm or less, so that both the size of the device is greatly reduced and the capacitance CF is greatly increased.

Although the thicknesses $t_1$ and $t_3$ of the outer piezoelectric layers 1 and 3 may be identical, they do not always need to be identical. However, in a vibration-symmetry aspect, it is preferable that $t_1 = t_3$.

Figure 7:
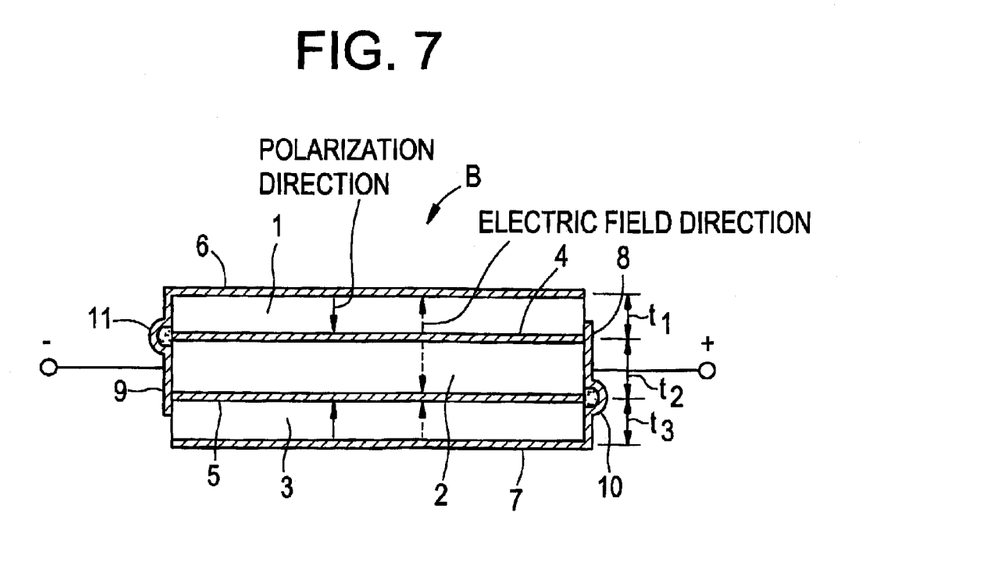
FIG. 7 is a sectional view showing a piezoelectric resonator according to a second preferred embodiment of the present invention.

FIG. 7 shows a piezoelectric resonator B according to a second preferred embodiment of the present invention, which uses the radial flexural mode vibration. The piezoelectric resonator B is preferably substantially the same as the piezoelectric resonator A, except that the central piezoelectric layer 2 is not polarized. Accordingly, by denoting portions identical to those of the piezoelectric resonator A by identical reference numerals, repetitious description is omitted.

Figure 8A:
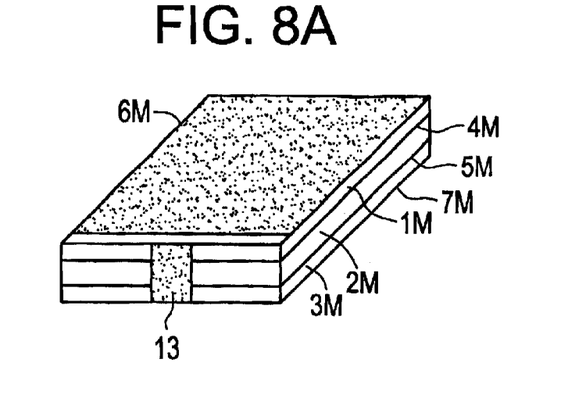
FIGS. 8A, 8B, and 8C are a perspective view, a section view, and a perspective view which show the process of manufacturing the piezoelectric resonator shown in FIG. 7.
Figure 8B:
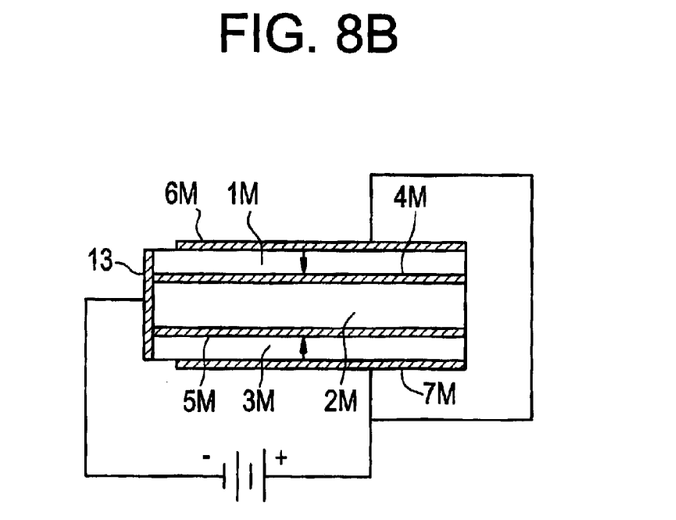
Figure 8C:
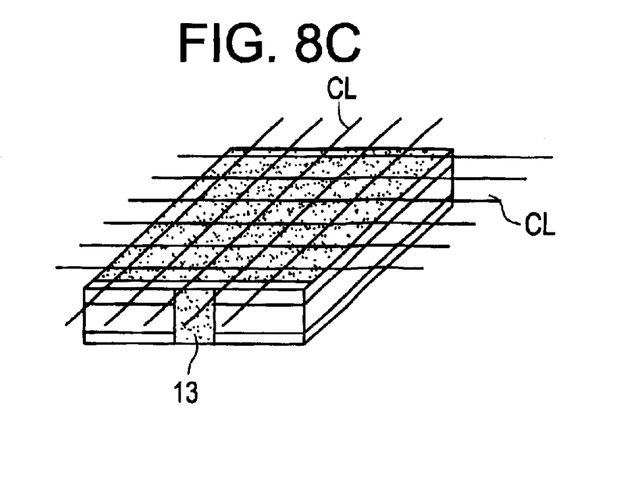

Referring to FIGS. 8A to 8C, the process of manufacturing the piezoelectric resonator B is described below.

As shown in FIG. 8A, at one end of stacked mother substrates 1M, 2M, and 3M as piezoelectric layers, a polarization electrode 13 which is conductive to internal electrodes 4M and 5M is produced. Next, by applying a high voltage to the top and bottom surface electrodes 6M and 7M and the polarization electrode 13, only two outer piezoelectric layers 1 and 3 are polarized in the directions shown by the arrows.

After that, as shown in FIG. 8C, by vertically and horizontally cutting the stacked mother substrates along the cut-lines C1 into small pieces, and forming connection electrodes 8 and 9 on sides of each piece, the piezoelectric resonator B in FIG. 7, in which the central piezoelectric layer 2 is not polarized, is obtained.

Figure 9:
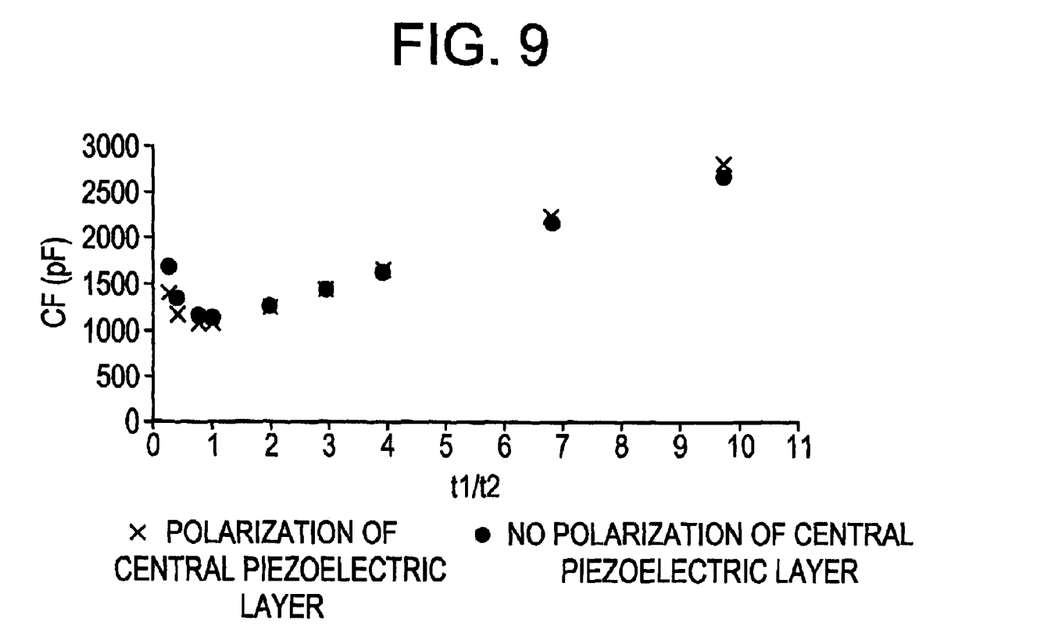
FIG. 9 is a graph showing the relationship between the ratio in thickness of each outer piezoelectric layer relative to the central piezoelectric layer and capacitance in the piezoelectric resonator shown in FIG. 7.
Figure 10:
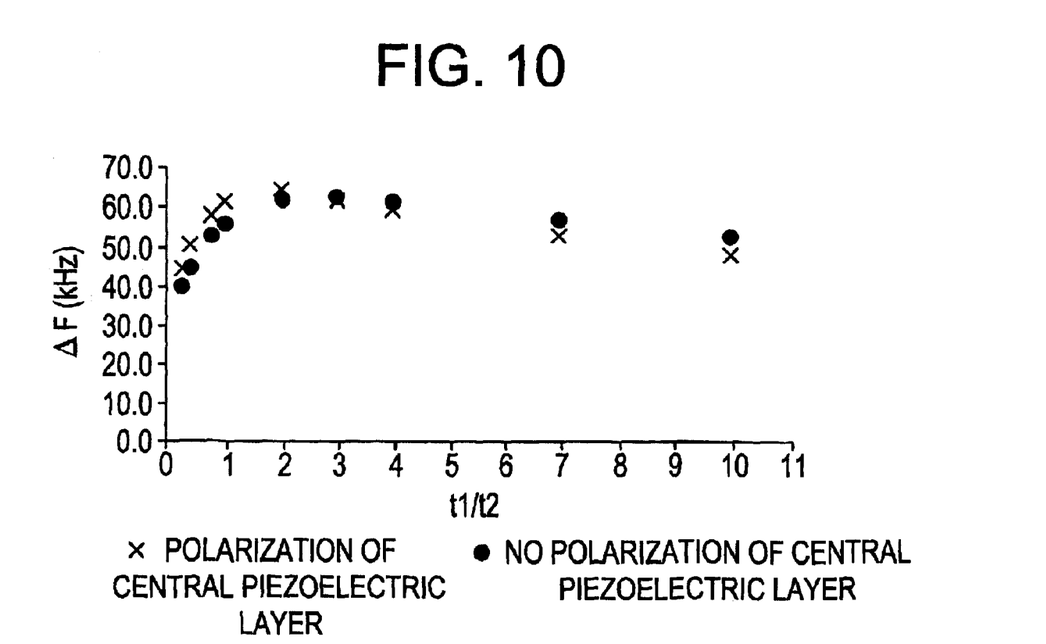
FIG. 10 is a graph showing the relationship between the ratio in thickness of each outer piezoelectric layer relative to the central piezoelectric layer and $\Delta F$ in the piezoelectric resonator shown in FIG. 7.
Figure 11:
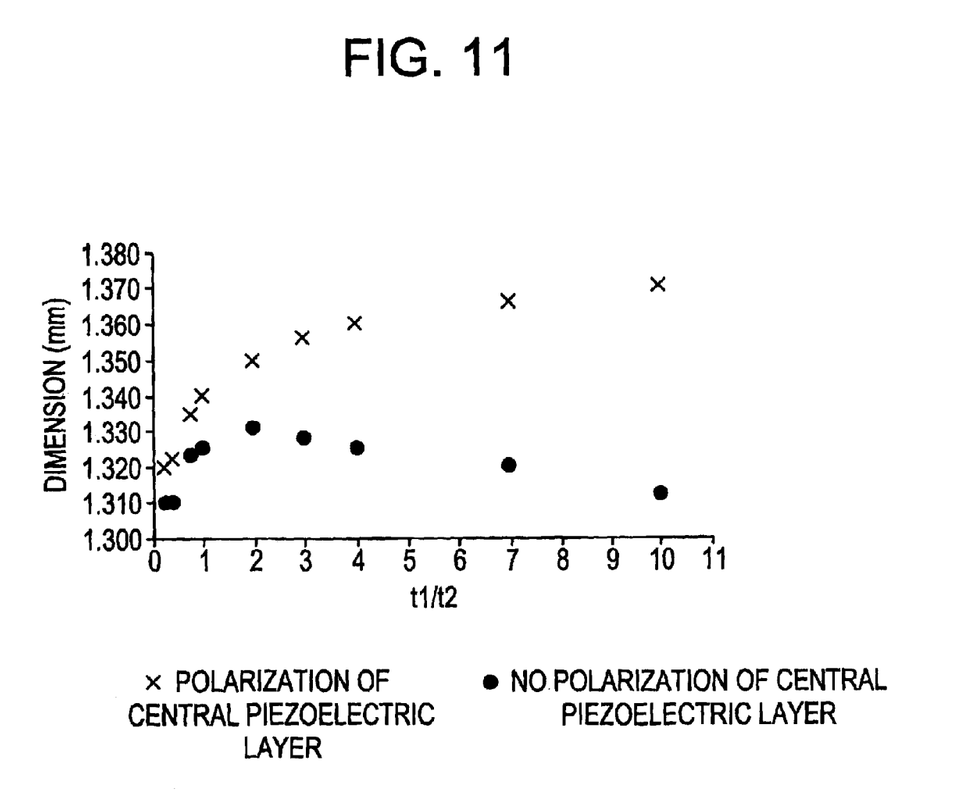
FIG. 11 is a graph showing the relationship between the ratio in thickness of each outer piezoelectric layer relative to the central piezoelectric layer and device size in the piezoelectric resonator shown in FIG. 7.

Similarly to FIGS. 4 and 5, FIGS. 9 to 11 show the results of measuring the electric characteristics of various types of the piezoelectric resonator B which were produced based on conditions that the thickness of the entirety is constant (0.18 mm), $t_1=t_3$, and $t_1/t_2=0.25$ to 10. FIG. 9 shows a change in inter-terminal capacitance CF obtained when changing $t_1/t_2$. FIG. 10 shows $\Delta F$ (=fa−fr) obtained when changing $t_1/t_2$. FIG. 11 shows a change in the device dimension (one side) when changing $t_1/t_2$, where resonant frequency fr=400 kHz. For comparison, FIGS. 9 to 11 each show a change concerning the piezoelectric resonator A in which the central piezoelectric layer 2 is polarized.

As shown in FIG. 9, inter-terminal capacitance CF obtained when changing $t_1/t_2$ changes similarly to that of the piezoelectric resonator A in which the central piezoelectric layer 2 has piezoelectric characteristics. In other words, the existence of the polarization in the central piezoelectric layer 2 influences the inter-terminal capacitance CF to a much lesser extent.

Concerning $\Delta F$, as shown in FIG. 10, in the range $t_1/t_2<3$, by setting the central piezoelectric layer 2 to have larger piezoelectric characteristics, a larger $\Delta F$ is obtained. In the range $t_1/t_2>3$, by controlling the piezoelectric layer 2 so as not to have larger piezoelectric characteristics, a larger $\Delta F$ is obtained.

Concerning the device dimension, FIG. 11 indicates that the maximum dimension (approximately 1.33 mm) is obtained at around $t_1/t_2=2$ and that the device dimension is small at $t_1/t_2<2$ and $t_1/t_2>2$. This indicates that, compared with the piezoelectric resonator A in which the central piezoelectric layer has piezoelectric characteristics, the piezoelectric resonator B in which the central piezoelectric layer does not have piezoelectric characteristics, can be manufactured to be a very small-sized device.

A piezoelectric resonator according to the present invention is not limited to a piezoelectric resonator having three piezoelectric layers, as descried in the foregoing preferred embodiments, but may be a piezoelectric resonator which uses a radial flexural mode vibration and in which an even number of at least four electrode layers and an odd number of at least three piezoelectric layers are alternately stacked.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric resonator using radial flexural mode vibration, comprising:
   an even number of at least four electrode layers; and
   an odd number of at least three piezoelectric layers;
   wherein:
   said at least four electrode layers and said at least three piezoelectric layers are alternately stacked;
   at least two piezoelectric layers among said at least three piezoelectric layers are polarized in a thickness direction;
   said at least four electrode layers are connected to one another such that in at least one piezoelectric layer among said at least three piezoelectric layers, an electric field is generated in a direction that is identical to the polarization direction of said at least one piezoelectric layer, and in at least another piezoelectric layer among said at least three piezoelectric layers, an electric field is generated in a direction that is opposite to the polarization direction of said at least another piezoelectric layer; and
   among said at least three piezoelectric layers, at least one piezoelectric layer has a thickness that is different from each of the thicknesses of the other piezoelectric layers.

2. A piezoelectric resonator according to claim 1, wherein said at least three piezoelectric layers have a relationship expressed by $$t_1=t_3 \neq t_2$$

where $t_2$ represents the thickness of the central piezoelectric layer among said at least three piezoelectric layers, and $t_1$ and $t_3$ represent the thicknesses of the other piezoelectric layers, respectively.

3. A piezoelectric resonator according to claim 1, wherein said at least three piezoelectric layers have a relationship expressed by $$1<t_1/t_2<3 \text{ and } 1<t_3/t_2<3$$

where $t_2$ represents the thickness of the central piezoelectric layer, and $t_1$ and $t_3$ represent the thicknesses of the outer piezoelectric layers, respectively.

4. A piezoelectric resonator according to claim 1, wherein, among said at least three piezoelectric layers, the central piezoelectric layer is polarized in the thickness direction.

5. A piezoelectric resonator according to claim 1, wherein, among said at least three piezoelectric layers, the central piezoelectric layer is not piezoelectrically active.

6. A piezoelectric resonator according to claim 1, wherein among said at least three piezoelectric layers which includes two outer piezoelectric layers and a central piezoelectric layer, the outer piezoelectric layers are oppositely polarized, and the central piezoelectric layer is polarized in a direction that is identical to one of the two outer piezoelectric layers.

7. A piezoelectric resonator according to claim 1, further comprising connection electrodes provided on two sides of said at least three piezoelectric layers and connected to the internal electrodes.

8. A piezoelectric resonator according to claim 1, wherein said at least three piezoelectric layers includes an upper piezoelectric layer, a central piezoelectric layer and a lower piezoelectric layer, an in the upper piezoelectric layer, the polarization direction and the electric field direction are opposite to each other, and in the central piezoelectric layer and the lower piezoelectric layer, the polarization directions and the electric field directions are identical to each other.

9. A piezoelectric resonator according to claim 8, wherein among said at least three piezoelectric layers which includes two outer piezoelectric layers and a central piezoelectric layer, the thicknesses of the outer piezoelectric layers are identical.

10. A piezoelectric resonator according to claim 8, wherein among said at least three piezoelectric layers which includes two outer piezoelectric layers and a central piezoelectric layer, the thicknesses of the outer piezoelectric layers are different.

11. A piezoelectric resonator according to claim 8, wherein said at least three piezoelectric layers includes two outer piezoelectric layers and a central piezoelectric layer, and the central piezoelectric layer is not polarized.

* * * * *